(12) United States Patent
Rivoir

(10) Patent No.: US 8,169,212 B2
(45) Date of Patent: May 1, 2012

(54) CALIBRATING SIGNALS BY TIME ADJUSTMENT

(75) Inventor: Jochen Rivoir, Magstadt (DE)

(73) Assignee: Advantest (Singapore) Pte Ltd, Singapore (SG)

( * ) Notice: Subject to any disclaimer, the term of this patent is extended or adjusted under 35 U.S.C. 154(b) by 677 days.

(21) Appl. No.: 12/281,477

(22) PCT Filed: Mar. 2, 2006

(86) PCT No.: PCT/EP2006/060411
§ 371 (c)(1),
(2), (4) Date: Apr. 24, 2009

(87) PCT Pub. No.: WO2007/098807
PCT Pub. Date: Sep. 7, 2007

(65) Prior Publication Data
US 2009/0219010 A1    Sep. 3, 2009

(51) Int. Cl.
*G01R 1/02* (2006.01)
(52) U.S. Cl. ............................................. 324/130
(58) Field of Classification Search .................. None
See application file for complete search history.

(56) References Cited

U.S. PATENT DOCUMENTS

| 4,541,065 A | 9/1985 | Faulkner et al. |
| 4,587,477 A | 5/1986 | Hornak et al. |
| 7,116,267 B2 * | 10/2006 | Schuster et al. ............... 342/174 |

FOREIGN PATENT DOCUMENTS

| DE | 103 40 009 | 6/2005 |
| EP | 0 858 162 | 8/1998 |
| WO | WO 03/052940 | 6/2003 |
| WO | WO 2007/098807 | 9/2007 |

OTHER PUBLICATIONS

Horsky, Pavel, "A 16 Bit + Sign Monotonic Precise Current DAC for Sensor Applications", Proceedings of the Design, Automation and Test in Europe Conference and Exhibition Designers' Forum, 3 pages, 2004.

Tang, ATK, et al., "Self-Calibration for High-Speed, High-Resolution D/A Converters", Advanced A-D and D-A Conversion Techniques and their Applications, Conference Publication No. 393, Jul. 6-8, 1994.

* cited by examiner

*Primary Examiner* — Paresh Patel
(74) *Attorney, Agent, or Firm* — Holland & Hart LLP

(57) ABSTRACT

A signal processing device having an adjustment unit for adjusting a time duration of each of a plurality of signals individually in accordance with an amplitude of the respective signal to thereby generate calibrated signals, and a combining unit for combining the calibrated signals.

21 Claims, 4 Drawing Sheets

CALIBRATING SIGNALS BY TIME ADJUSTMENT

BACKGROUND OF THE INVENTION

The present invention relates to calibration of signals.

Conventionally, a mismatch of signals to be processed together may be calibrated by correcting an amplitude of the signals. The smaller the dimensions, the more difficult becomes the accurate adjustment of signal amplitudes due to an increasing influence of mismatch of components of electrical circuits, particularly of integrated circuits.

SUMMARY

According to an embodiment, a digital-to-analog converter for converting digital data into an analog signal may have an adjustment unit for individually adjusting a time duration of a plurality of signals in accordance with the respective amplitude of the respective signal in such a manner that an integral of the amplitude of the respective signal over the time duration yields a respective predetermined value or falls within a respective acceptable range to thereby generate calibrated signals; a combining unit for combining the calibrated signals.

According to another embodiment, measurement apparatus may have a signal generation unit adapted to generate a plurality of signals related to a measurement carried out by the measurement apparatus; a digital-to-analog converter for converting digital data into an analog signal having an adjustment unit for individually adjusting a time duration of a plurality of signals in accordance with the respective amplitude of the respective signal in such a manner that an integral of the amplitude of the respective signal over the time duration yields a respective predetermined value or falls within a respective acceptable range to thereby generate calibrated signals; a combining unit for combining the calibrated signals.

According to an exemplary embodiment of the present invention, a signal processing device is provided comprising an adjustment unit for adjusting a time duration of each of a plurality of signals individually (for instance to be different) in accordance with an amplitude of the respective signal to thereby generate calibrated signals, and a combining unit (particularly a summation unit) for combining the calibrated signals.

According to another exemplary embodiment, a measurement apparatus is provided, the measurement apparatus comprising a signal generation unit adapted to generate a plurality of signals related to a measurement carried out by the measurement apparatus, and a signal processing device having the above-mentioned features for calibrating the signals.

According to still another exemplary embodiment, a signal processing method is provided comprising adjusting a time duration of each of a plurality of signals individually in accordance with an amplitude of the respective signal to thereby generate calibrated signals, and combining the calibrated signals (for instance in accordance with a predetermined logical function, particularly a summing function).

According to yet another exemplary embodiment, a computer-readable medium is provided, in which a computer program of signal processing is stored, which computer program, when being executed by a processor, is adapted to control or carry out the above-mentioned method.

According to a further exemplary embodiment, a program element of signal processing is provided, which program element, when being executed by a processor, is adapted to control or carry out the above-mentioned method.

Embodiments of the invention can be partly or entirely embodied or supported by one or more suitable software programs, which can be stored on or otherwise provided by any kind of data carrier, and which might be executed in or by any suitable data processing unit. Software programs or routines can be advantageously applied for signal processing for calibrating or correcting signals in the time domain. The time-related calibration according to an embodiment of the invention can be performed by a computer program, i.e. by software, or by using one or more special electronic optimization circuits, i.e. in hardware, or in hybrid form, i.e. by means of software components and hardware components.

According to an exemplary embodiment, one or more signals is or are corrected—not or not only considering the signal amplitude as an adjustment or fitting parameter to be varied so as to correct a signal—but by adjusting the time characteristics, particularly the duration of such a signal or signals. Particularly, the duration or interval of the signal on-time may be adjusted so that a signal contribution, for instance an integral of the signal amplitude over the on-time, yields a predetermined calibration value or falls within an acceptable calibration value range. Taking such a measure is a computationally simple way of correcting a signal which also works when the trend of electronic member miniaturization continues in the future, that is to say when electronic member dimensions are further reduced. This trend may cause amplitude mismatch and may make a purely amplitude-related correction more and more difficult and costly.

Such a signal correction may be particularly applied to or may be performed with any device in which a plurality of signals are to be combined, for instance shall be added to one another, for instance in a digital-to-analog-converter. In such a device, it may be advantageous to ensure that the signal contribution of the each individual adding branch is within certain limits, for instance is the same for each individual adding branch or fulfils a predetermined ratio condition between each of the individual adding branches. This may allow, when adding a plurality of individual signals, that all signals are weighted correctly, for example evenly.

Such a digital-to-analog-converter may be integrated in a test device in which an arbitrary waveform generator generates analog waveform signals to be applied to a device under test (DUT, for instance the microphone input of a cellular phone chip). Such analog sine waveforms may then be applied to pins of a DUT as a stimulus signal, and a digital response signal of the DUTs may be evaluated by an analysis unit of the tester. The output of such a tester may be a result signal indicative of whether or not the device under test is acceptable or has failed the test. In such a scenario, it may be advantageous to integrate a signal processing device according to an embodiment of the invention in such a test device, particularly within a digital-to-analog converter (DAC) of such a test device.

In a converter with controlled current sources, both amplitude and on-time of each individual current source may have an influence on the contribution of this current source to an added signal being formed by summing up the contributions of the controlled current sources. For calibrating such signals so as to compensate for current source mismatch, a current amplitude value may be difficult to be modified or controlled accurately in the light of an increasing influence of electronic member mismatch which results from a continued miniaturization of electronic components, particularly of a monolithically integrated circuit. Based on this recognition, according to an exemplary embodiment of the invention, the timing of such signals may be adjusted. Such a strategy may be possible even in the presence of small electronic member dimensions.

Particularly in the CMOS technology, electronic members become increasingly faster but also increasingly smaller and sensitive. Thus, problems with mismatch may become more severe, since the relative deviations of the electronic member parameters (like gains of an amplifiers, threshold voltages of MOSFETs, etc.) become larger. Therefore, it may become increasingly difficult to manufacture exactly identical electronic members like MOSFETs, since smaller structures may go hand in hand with smaller amounts of electric charges for switching and with faster rewriting of information. According to an exemplary embodiment of the invention, an analog information may be encoded or corrected in the time domain.

Such a time adjustment for signal correction or signal calibration may be particularly implemented in a Nyquist digital-to-analog-converter with current control. In a ten bit Nyquist DAC, ten current sources may be implemented which may be binary weighted. With each sample period, an electric current may flow for one clock time. In such a Nyquist DAC, the current ratio of the different current sources should ideally fulfill high precision requirements, otherwise it may happen that inaccuracies in the higher amplitude current paths may make it difficult or impossible to evaluate information encoded in lower amplitude current paths. However, according to an exemplary embodiment, the individual signals of such a Nyquist DAC may be corrected using a time calibration which works also with very small electronic member dimensions.

Another exemplary embodiment is a multi-bit Sigma-Delta DAC in which a nominal current value for a plurality of current sources should be identical. For such a multi-bit Sigma-Delta DAC, a number n of current sources may be present each of which should contribute an identical current value of I. A relevant error may be the mismatch error in proportion to the sum of all current sources, i.e. the more current sources, the less sensitive to mismatch. By exactly adjusting the contributions of the individual current sources by time calibration according to an exemplary embodiment, such a problem may be overcome or at least reduced.

In order to further increase the accuracy of such a DAC, dynamic element match (DEM) may be implemented in exemplary embodiments of the invention. In such a system, only a part of the current sources is switched on at a time, and the different current sources are permutated or mixed. Therefore, some kind of averaging effect may occur which may allow to eliminate or reduce problems with electronic member mismatch. However, over short time periods, such an averaging may be difficult, and even in such a scenario, the accuracy of the signal processing may be improved by correcting the signals in the time domain.

According to an exemplary embodiment, an identical (or more generally a predetermined) contribution of each of a plurality of current sources within one clock period may be set, wherein such a contribution may be weighted so as to contribute equally (or more generally in accordance with a predetermined weighting scheme) to an output, for instance after the signal has passed a reconstruction filter. In most cases the reconstruction filter is a low-pass filter. However, a band-pass delta-sigma DAC may use a band-pass filter. In other words, it is not absolutely necessary that the current amplitude contributions of all the current sources are identical, but the charge contributions of the individual current sources over the respective on-times should be the same or should be in predetermined ratios to one another.

In other words, for each of the current sources, the integral of the current value over the on-time may be controlled, or in other words the charge contribution of each current source may be controlled be adjusting the respective on-time values. A reconstruction filter provided at an output may be a low-pass filter or a band-pass filter. Such a low-pass filter may have a cut-off frequency of approximately 50 to 100 clock periods.

The time adjustment scheme according to an embodiment of the invention which is based on an integral charge adjustment instead of being based on a pure current amplitude adjustment, may be particularly advantageously implemented in a "return to zero" (RZ) processing scheme. However, additionally, it may be optionally possible to also adjust the amplitude. As an alternative to the adjustment of current signals, it is also possible to adjust voltage signals or, more generally, any kind of electric signal.

Exemplary fields of application of embodiments of the invention are digital-to-analog-converters, multiplying amplifiers, and many other electronic members or groups thereof. A further field of application of embodiments of the invention is a pin electronic in a tester device, like a 93000 test device of Agilent Technologies.

In a digital-to-analog-converter according to an exemplary embodiment, the number of elements may be, for instance, in the range between four and 128. The amplitudes of the current values may be in the range of microamperes. A time of a clock period may be particularly in the range between microseconds and hundreds of picoseconds.

Next, further exemplary embodiments of the invention will be explained. In the following, further exemplary embodiments of the signal processing device will be explained. However, these embodiments also apply for the measurement device, for the method of signal processing, for the computer-readable medium and for the program element.

The device may be adapted for calibrating an electric signal, particularly a current signal or a voltage signal. However, any other kinds of signals, for instance optical signals or wireless signals propagating as electromagnetic waves, may be controlled in time as well. Thus, optoelectronics and all kinds of wireless signal transmission systems may be fields of application of embodiments of the invention.

Furthermore, the device may be adapted for calibrating an analog or a digital signal. When processing such signals, it may be important that the individual contributions of the signals are weighted correctly. This may be particularly of interest when converting between a digital signal and an analog signal.

Moreover, the device may be adapted for maintaining the amplitude of the signal unchanged. In other words, the calibration according to an embodiment of the invention may disregard the amplitude of the signal and may be based on an individual adjustment of the signal time so that for instance a current contribution of each of the signals is weighted correctly.

The adjustment unit may be adapted for adjusting the time duration of the signal in such a manner that an integral of the amplitude over the time duration yields a predetermined value, for instance for all of the signals to be calibrated. More particularly, in a scenario in which a signal value is constant over a switch-on period, the adjustment unit may be adapted for adjusting the time duration of the signal in such a manner that a product of the amplitude and the time duration yields a predetermined value or falls in a predetermined range of values. Such a scenario may occur with a signal having a constant amplitude over time (for instance a value of "1" or "0") so that it may be sufficient to ensure that the area under the signal curve (in an amplitude-time coordinate system) is acceptable. This may allow for a fast adjustment of the signal with low computational burden.

The adjustment unit may be adapted for adjusting the time duration of the signal in accordance with the amplitude of the signal to thereby calibrate the signal with respect to one or more further signals. Thus, when a plurality of individual signals (particularly individual components to be summed up) have to be combined, for instance have to be added to one another, it may be necessitated or advantageous that the relation of the individual signals, with regard to their contributions to the combined signal, is correct or is corrected.

The adjustment unit may be adapted for adjusting the time duration of the signal in such a manner that an integral of the amplitude over the time duration of the signal essentially equals to an integral of an amplitude over a time duration of one or more further signals. Thus, the charge contribution of each signal may be calibrated or adapted between the individual signals.

The adjustment unit may be adapted for adjusting the time duration of the signal and of at least one further signal to be summed with the signal in such a manner that individual integrals of the amplitude over the time duration of the signal and of the at least one further signal essentially equal to a predetermined ratio. Such an embodiment may be implemented in the context of a binary weighted (e.g. $2^n$) DAC. In such a case, not all elements of the DAC contribute equally to a digital signal, but contribute in a significantly varying manner, for example in accordance with a $2^n$ function.

The device may comprise a combining unit for combining the calibrated signal with one or more further signals. Such a combining unit may be an adding unit or any other kind of logic gate, operating according to a predetermined Boolean function. With such a logic gate, any logical combination between a plurality of signals is possible, for instance a logical AND combination, a logical OR combination, a logical EXCLUSIVE OR combination, an inverter function, or the like.

The combining unit may be adapted for adding the calibrated signal to the one or more further signals. In such a scenario it may be advantageous that the one or more further signals is or are also calibrated, advantageously in the same manner as the signal. This can be achieved by providing a plurality of similarly constructed signal correction units, one for each of the signals.

Furthermore, the device may comprise a filter unit coupled to an output of the combining unit. With such a filter unit, for instance a low-pass filter, it is possible to filter out undesired frequency components. The filter unit may also be a band-pass filter, particularly in combination with a band-pass delta-sigma converter.

The device may be adapted as any kind of digital-to-analog converter for converting digital data represented by the signal and one or more further signals into an analog signal. For such a conversion, it may be advantageous to ensure that the signal contributions of the individual signals to be added to one another are weighted correctly.

The digital-to-analog converter may comprise a dynamic element matching (DEM) function, may be a Nyquist digital-to-analog converter, may be a multi-bit Sigma-Delta digital-to-analog converter or may be any other type of over-sampled multi-bit digital-to-analog converter. It is also possible that such a digital-to-analog converter is part of or connected to an analog-to-digital converter as a feedback digital-to-analog converter.

The digital-to-analog converter may be a multiplying digital-to-analog converter, wherein an analog input of the digital-to-analog converter may be connected to a switch unit of the adjustment unit, and wherein the switch unit may be controlled by a digital input of the digital-to-analog converter so as to adjust the time duration by controlling an on-time of the switch. In such a multiplier or multiplying DAC, the analog input may be connected to the switch input(s), and the digital input may determine the time duration of the switch-on time.

The adjustment unit may be adapted for (digitally) adjusting the time duration of the signal by a counter based adjustment. Alternatively, the adjustment unit may be adapted for an (analog) adjustment of the time duration of the signal by a delay line based adjustment. In other words, in such a configuration a signal may be guided along a delay line so as to be adjusted in time.

The detection unit may be adapted for detecting an amplitude of a plurality of signals to be summed up, and the adjustment unit may be adapted for adjusting a time duration of the plurality of signals in accordance with the amplitudes of the plurality of signals to thereby calibrate the plurality of signals. The device may further comprise a digital-to-analog converter unit adapted for converting the plurality of signals representing a digital signal into an analog signal by summing up the plurality of signals, and may (optionally) comprise a filter unit coupled to an output of the digital-to-analog converter unit. According to such an exemplary embodiment, a DAC may be provided comprising multiple summed signals, the summed signal being filtered, and a subset (including all) of summed signals may be provided with adjustable pulse duration. Pulse durations may be adjusted to improve or optimize the quality of the DAC output signal.

According to an exemplary embodiment, a DAC is provided in which multiple individual elements are combined to contribute to the DAC output. The on-time of the individual elements may be adjustable. The on-time may be adjusted to improve the quality of the DAC output.

Next, further exemplary embodiments of the measurement apparatus will be explained. However, these embodiments also apply for the signal processing device, for the signal processing method, for the computer-readable medium and for the program element.

The measurement apparatus may comprise at least one of an analog-to-digital converter, a digital-to-analog converter, a sensor device, a test device for testing a device under test (particularly a microphone input of a cellular phone chip) or a substance (like a chemical, physical or biological substance), an amplifier, a multiplying amplifier, a device for chemical, biological and/or pharmaceutical analysis, a fluid separation system adapted for separating compounds of a fluid, a capillary electrophoresis device, a liquid chromatography device, a gas chromatography device, an electronic measurement device, and a mass spectroscopy device. More generally, the measurement apparatus can be a measurement apparatus of any technical field in which a signal calibration may be desired. Thus, the measurement apparatus may find application in many fields of electronics and measurement applications, for instance in the field of life science or in the field of biosensors, or in any field of analog or digital electronics.

Next, further exemplary embodiments of the signal processing method will be explained. However, these embodiments also apply for the signal processing device, for the measurement apparatus, for the computer-readable medium and for the program element.

The method may comprise detecting the amplitudes of the plurality of signals by detecting a spectrum of a filtered sum of the plurality of signals, and the adjusting may comprise adjusting a time duration of the plurality of signals so as to obtain a predetermined spectrum. In other words, a dynamic, spectrum-based calibration may be performed. Thus, the spectrum of the filtered sum may be detected, and the time duration may be adjusted in accordance with a desired spectrum.

BRIEF DESCRIPTION OF THE DRAWINGS

Other objects and many of the attendant advantages of embodiments of the present invention will be readily appreciated and become better understood by reference to the following more detailed description of embodiments in connection with the accompanied drawings. Features that are substantially or functionally equal or similar will be referred to by the same reference signs.

Embodiments of the present invention will be detailed subsequently referring to the appended drawings, in which.

Figure 1A:
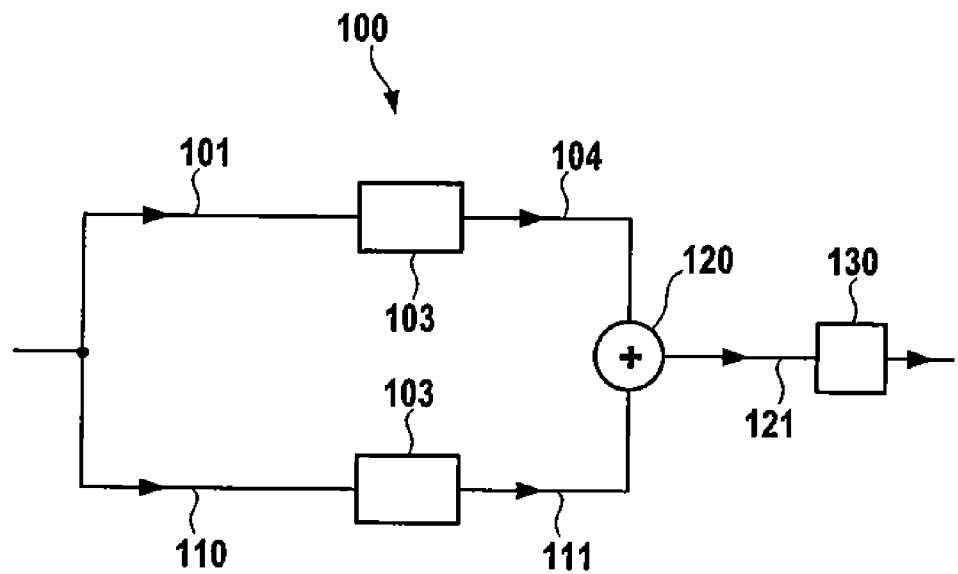
FIG. 1A shows a signal processing device according to an exemplary embodiment of the invention.

The illustration in the drawing is schematically.

DETAILED DESCRIPTION OF THE INVENTION

In the following, referring to FIG. 1A, a signal processing device 100 according to an exemplary embodiment of the invention will be described.

The signal processing device 100 comprises a plurality of elements of signal processing, wherein in the following a first element will be explained. This first element comprises an adjustment unit 103 for adjusting a time duration of a signal 101 individually in accordance with an amplitude of the signal 101 to thereby generate a calibrated signal 104. A combining unit 120 is provided for combining the calibrated signal 104 with one or more further calibrated signals 111 of the other elements of signal processing. For example, the second element comprises an adjustment unit 103 for adjusting a time duration of a further signal 110 individually (and independently of the calibration of the signal 101) in accordance with an amplitude of the further signal 110 to thereby generate a further calibrated signal 111 (in the embodiment of FIG. 1A, the signal 101 equals the further signal 110). A detection unit (not shown) may be provided for detecting an amplitude of the current signal 101 and of the further current signal 111. The current signal 101 can be considered as a rectangular signal in the current-time domain. The calibrated signal 104 provided at an output of the adjustment unit 103 may have the same amplitude as the input signal 101, but its time duration may be increased or reduced with respect to the time duration of the input signal 101 depending on whether the input signal 101 amplitude is too small or too large.

The adjustment unit 103 more particularly adjusts the time duration of the current signal 101 so that a multiplication of the current amplitude and the corrected time duration yields a corresponding value. This value may be prestored in the adjustment unit 103. In other words, the current signal 101 may be corrected so that the entire charge included in the corrected current signal 104 is normalized or standardized.

In a similar manner, a second current signal 110 is corrected or calibrated so that the corresponding second calibrated signal 111 carries essentially the same charge as the first corrected current signal 104. Both signals 104, 111 are then processed together by an adding unit 120 for adding the signals 104 and 111 to provide a processed output signal 121 representing the sum of the signals 104 and 111. This signal 121 may be smoothed or refined by a low-pass filter 130.

Thus, the signals 101, 110 are processed in a manner so that the function of the signal processing device 100 may be denoted as a multiplying digital-to-analog converter, since the input signals 101, 110 are converted into a single output signal 121.

In the following, referring to FIG. 1B, a measurement apparatus 150 according to an exemplary embodiment of the invention will be described.

The measurement apparatus 150 is adapted as a test device for testing a device under test (DUT) 153.

A user may operate the measurement device 150 via a graphical user interface 154, for instance a computer. Via this computer 154, a user may specify a test, for instance define a test routine and/or provide the system 150 with parameters regarding the DUT 153.

In accordance with the user-defined test, the control computer 154 sends a signal 101 to a signal generation unit 151 which is adapted to generate a signal related to a measurement to be carried out by the measurement apparatus 150. This signal may be, for instance, a digital signal which may be converted into an analog signal by a digital-to-analog converter 152 implemented in the signal generation unit 151.

Figure 1B:
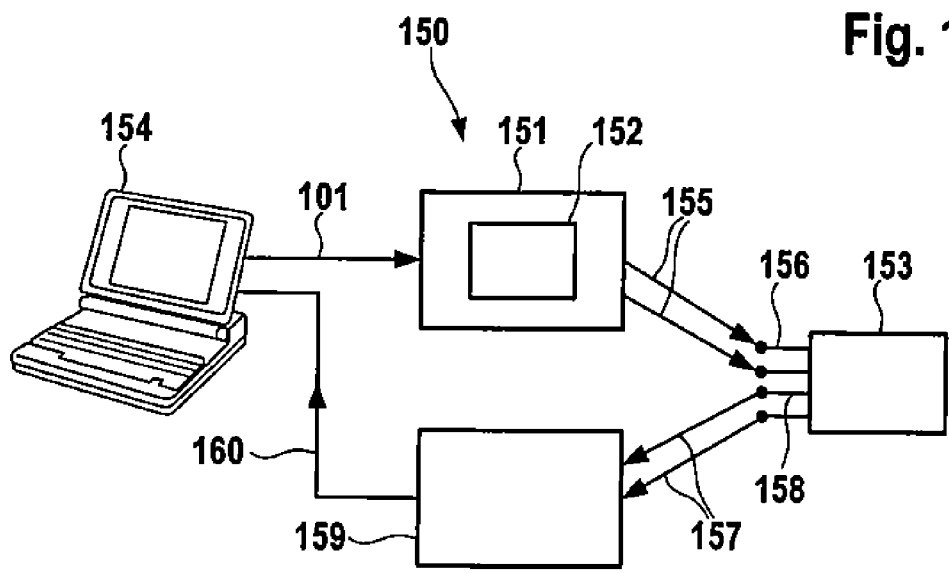
FIG. 1B shows a measurement apparatus according to an exemplary embodiment.

Thus, a system as shown in FIG. 1A may be integrated within the digital-to-analog converter 152 of the signal generation unit 151. The converted signal may be a basis for a stimulus signal 155 which is to be applied to various pins 156 of the device under test 153. The device under test 153 may be, for instance, a memory product like a DRAM storage device to be tested with regard to its function.

In accordance with the stimulus signals 155, the functionality of the DUT 153 is tested. After having traversed an electric circuitry of the DUT 153, response signals 157 are provided at output pins 158 of the device under test 153. These output signals 157 may be indicative of a function of the device under test 153.

An evaluation unit 159 evaluates the response signals 157 and decides, based on a comparison of the signal 157 values with expected values, whether the DUT 153 has passed the test or not. In accordance with this test result, a pass/fail indicating signal 160 is supplied to the control computer 154. On a display of the control computer 154, the result of the test of the device under test 153 may be presented to a human user for evaluating the quality of the DUT 153.

Within the digital-to-analog converter 152, the stimulus signals 155 may be calibrated so that signal mismatch may be reduced, avoided or eliminated. For this purpose, the signals may be adjusted or corrected in the time domain, and if desired, additionally in the current amplitude domain.

Next, referring to FIG. 2, a current steering Nyquist digital-to-analog converter 200 according to an exemplary embodiment of the invention will be explained.

At an input of the DAC 200, digital signals $D_{N-1}$, $D_{N-2}$, ..., $D_1$, $D_0$ are provided at inputs 201. $D_{N-1}$ represents the most significant bit (MSB), whereas the input signal $D_0$ represents the Least Significant Bit (LSB). Furthermore, a plurality of current sources 202 are provided, one for each element of the digital-to-analog converter 200.

Furthermore, each of the elements of the DAC 200 includes a time adjustment block 203 between the data input $D_k$ 201 and a switch control 204, the time adjustment block 203 providing a switch signal for selectively opening or closing the assigned switch 204. The individual signals of the current sources 202 are supplied to an adding unit 120 when the respective transistor switch 204 is closed by a corresponding value of the signals provided by the respective time adjustment block 203. The signals provided at the output of the respective transistor switches 204 are added using the adding unit 120 and may then be conveyed to a reconstruction filter 130, for instance a low-pass filter. Thus, a calibration is performed in the path controlling the switches 204.

An additional (common) clock input CLK 205 may be supplied to each of the time adjustment blocks 203.

Figure 2:
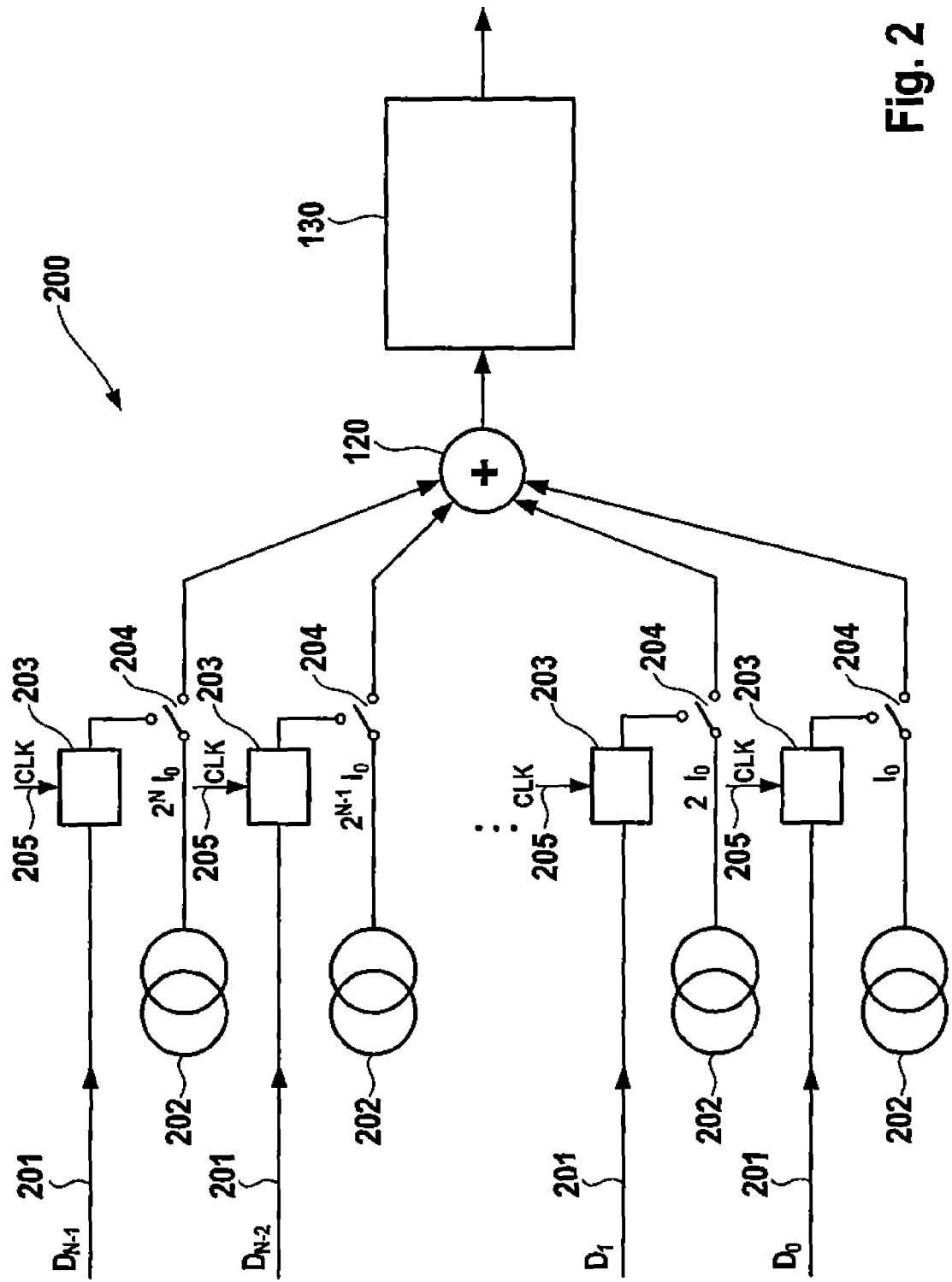
FIG. 2 shows a Nyquist digital-to-analog converter according to an exemplary embodiment of the invention.

The embodiment of FIG. 2 allows for a DAC mismatch calibration using pulsewidth adjustment. Therefore, mismatch errors which may conventionally occur during digital-to-analog conversion may be reduced or eliminated.

In the case of the current steering Nyquist DAC 200, the binary weighted current sources 202 are summed. However, in practical applications, it may happen that the current sources 202 are not exactly binary weighted, which may limit the linearity of the conversion. Although it is possible, by using highly symmetrical designs and layouts to minimize the mismatch (to, for instance, 1%), the calibration of the calibration units 203 in the time domain may significantly improve the linearity and the accuracy of the digital-to-analog conversion. Each of the current sources 202 may be switched on for the duration of a sample period, wherein the switch signal may have an NRZ format (non return to zero).

In the following, referring to FIG. 3, a multi-bit Delta-Sigma digital-to-analog converter 300 according to an exemplary embodiment of the invention will be described.

An input signal is received by a multi-bit Sigma-Delta modulator 301 and is supplied to a thermometer code unit 302. The thermometer code unit 302 is coupled to a dynamic element matching unit 303 at an output of which signals $S_0$, $S_1$, ..., $S_{N-2}$, $S_{N-1}$ are provided. The signals $S_0$, $S_1$, ..., $S_{N-2}$, $S_{N-1}$ are processed by respective time adjustment blocks 203, and processed signals at outputs of the time adjustment blocks 203 serve as switching control signals to operate transistor switches 204 so that an electric current provided by current sources 202 may be supplied to a summing unit 120 for summing up the corrected signals and from there to a low-pass filter unit 130.

Figure 3:
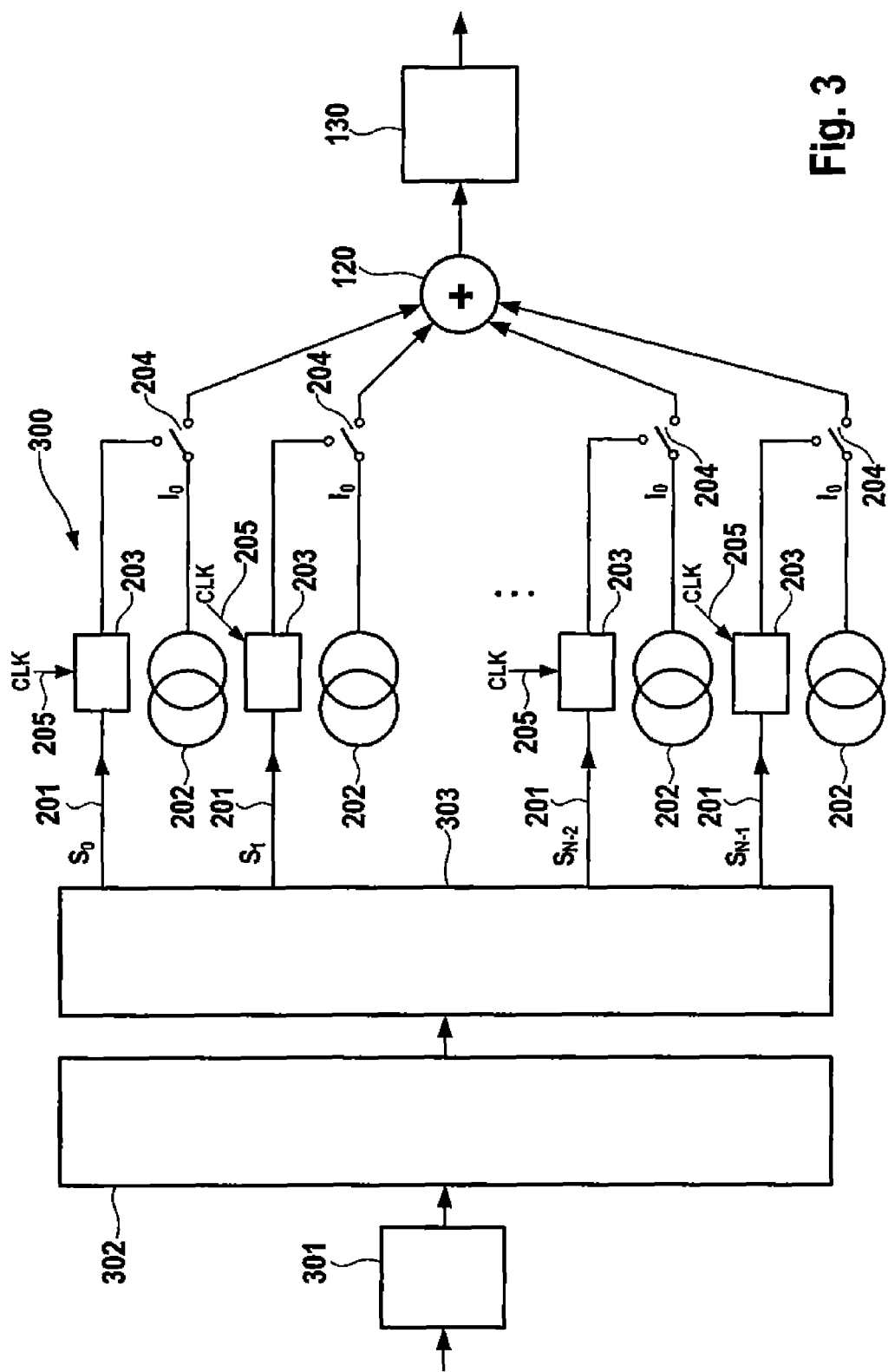
FIG. 3 shows a multi-bit Sigma-Delta digital-to-analog converter according to an exemplary embodiment of the invention.

It is noted that the functionality of the correction devices 203 may also be implemented at alternative positions in the signal processing path of FIG. 3.

In the DAC 300, a summation of n out of N presumably equal current sources 202 is performed. The switch signals $S_i$ have NRZ format. In reality, the current sources 202 are not exactly equal, which limits linearity and which introduces element mismatch. With a highly symmetrical design and layout, the mismatch may be reduced to, for instance, 1%. The dynamic element matching performed by the dynamic element matching unit 303 converts mismatch error into noise so as to further reduce the non-linearity. Additionally, the correction units 203 may correct the individual signals in the time domain before summing up the corrected signals by the summing unit 120.

In the following, further aspects concerning dynamic element matching (DEM) will be explained.

Dynamic element matching may randomize which subset of n currents is selected from all N currents. It may make the selection independent of the amplitude and may thus make the error independent of the signal. Harmonics may be removed. In average, all current sources may be selected equally often. In average, mismatch error may be removed or reduced, but only in average. The mismatch error is not entirely removed, but converted into broadband noise. So-called "mismatch shaping" can shape the spectrum of the mismatch error. In conclusion, the effect of mismatch errors can be reduced but not eliminated. Techniques to reduce the initial mismatch error may be implemented according to an exemplary embodiment of the invention, since the signals to be summed are corrected or calibrated by the units 203, wherein an individual unit 203 may be provided for each of the DAC elements.

In modern CMOS processes, levels are increasingly difficult to control (due to shrinking supply voltages, increasing component mismatch, etc.), but frequency increases consistently, which makes timing easier to control. A reconstruction filter which may be appropriate for a DAC may apply low-pass filtering, for instance takes some kind of average. High frequency distortion does not matter. Therefore, according to an exemplary embodiment of the invention, instead of varying the current itself, the contribution of one current source is calibrated by varying the on-time (pulsewidth) of the switch signal.

This will be explained in more detail referring to FIG. 4.

Figure 4:
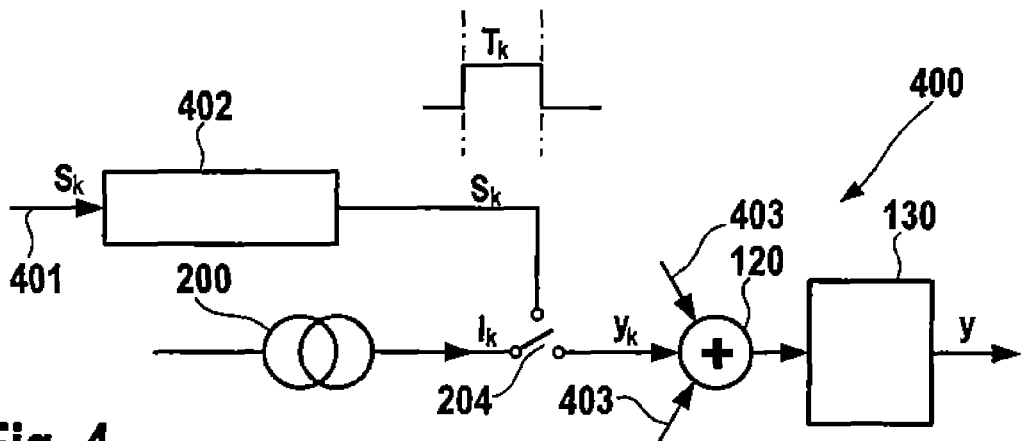
FIG. 4 shows a signal processing device according to an exemplary embodiment of the invention.

FIG. 4 shows a signal processing device 400 according to an exemplary embodiment of the invention. At an input 401, a bit stream $S_k$ is applied. The bit stream $S_k$ may be guided through a pulsewidth adjustment unit 402. A correspondingly generated calibration signal $s_k$ is applied to control a transistor switch 204. Only when the transistor switch 204 is closed, namely during the time period $T_k$ during which the signal $s_k$ is "high", electric current from the current source 200 is supplied to an adding unit 120 which adds the corrected signal $y_k$ to further signals 403. The summed signal is transmitted to a low-pass filter 130 so that an output signal y is generated.

The contribution of current source k to the output signal y is the average of $y_k$, i.e. the area $A_k = I_k \times T_k$. The pulsewidths $T_k$ are adjusted such that all areas $I_k \times T_k$ are equal for all current source contributions $y_k$.

Such a principle may be easily applied to any other kind of digital-to-analog converter, for instance to a Nyquist DAC, to an over-sampled multi bit DAC, and can be combined with dynamic element matching, if desired.

Figure 5:
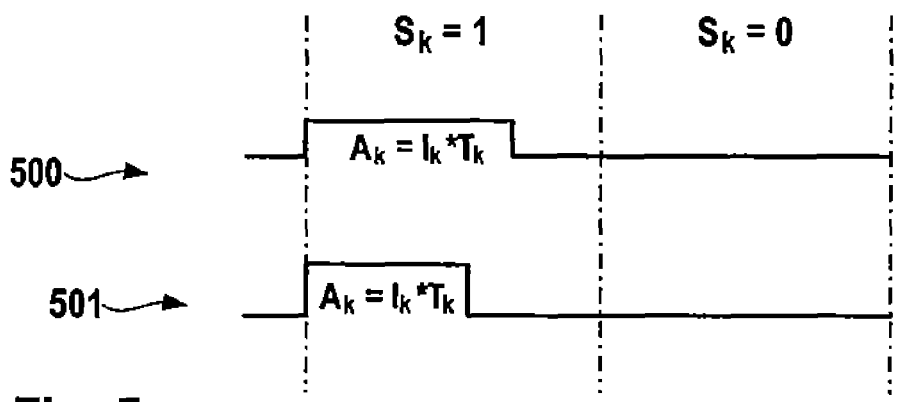
FIG. 5 shows a timing scheme for the signal processing device of FIG. 4.

FIG. 5 shows the result of the calibration performed in accordance with FIG. 4. FIG. 5 shows the current source k under two conditions, that is why the index is denoted as 'k' for the upper and the lower time plot.

FIG. 5 plots the time dependence of a small amplitude current signal 500 and of a large amplitude current signal 501. The small amplitude current signal 500 is "on" for a relatively long time to compensate for the smaller current amplitude as compared to the current amplitude and the on-time of the large amplitude current signal 501. The functionality of the signal calibration is that the area $A_k$ is made identical for the small current signal 500 and for the large current signal 501 by adjusting the value $T_k$.

Figure 6:
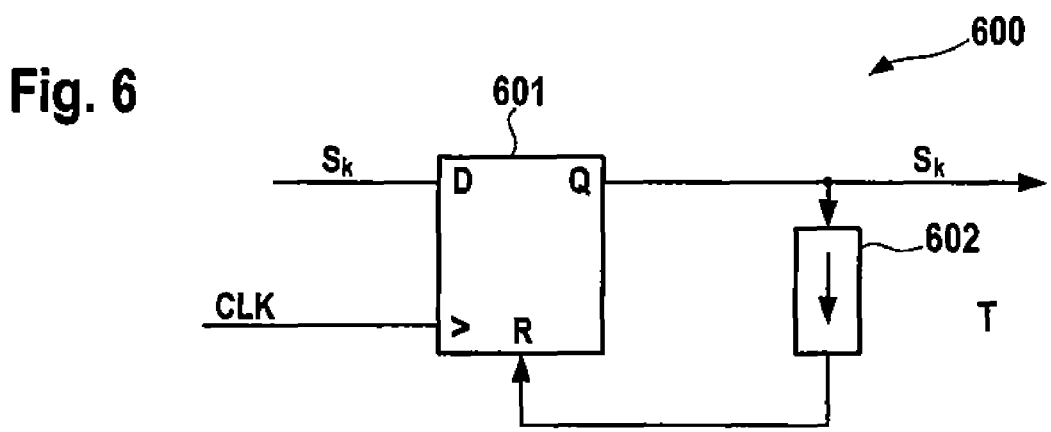
FIG. 6 shows a pulsewidth adjustment unit according to an exemplary embodiment of the invention.

FIG. 6 shows an exemplary embodiment of a pulsewidth adjustment unit 600.

An input signal $S_k$ is input to a processing unit 601. A clock signal CLK (sample clock) is provided at another input of the unit 601. A delay time T is added by a delay time unit 602. At an output of the pulsewidth adjustment unit 600, the corrected signal $s_k$ is provided.

The embodiment of FIG. 6 shows an analog (delay line based) adjustment for fast sample rates. With such an embodiment, at 10 Msa/s and 10 ps resolution, a mismatch of 0.005% may be obtained. At 100 Msa/s and 10 ps resolution, a mismatch of 0.05% may be obtained.

As an alternative to such an analog adjustment, it is also possible to provide for a digital (counter based) adjustment for slow sample rates. This may yield, at 1 Msa/s and 1 GHz clock, a mismatch of 0.05%.

According to an exemplary embodiment, the calibration of element mismatch using return-to-zero (RZ) pulsewidth adjustment for DACs that are based on switched sum of elements is provided. According to exemplary embodiments, a Nyquist DAC, or an oversampled (for instance Delta-Sigma) multi bit DAC (optionally combined with DEM or mismatch shaping), or a feedback DAC inside an ADC is provided. According to an embodiment, the adjustment is performed using a counter or delay line or any other scheme.

It should be noted that the term "comprising" does not exclude other elements or features and the "a" or "an" does not exclude a plurality. Also elements described in association with different embodiments may be combined. It should also be noted that reference signs in the claims shall not be construed as limiting the scope of the claims.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A digital-to-analog converter for converting digital data into an analog signal, comprising:
an adjustment unit for individually adjusting a time duration of a plurality of signals in accordance with the respective amplitude of the respective signal in such a manner that an integral of the amplitude of the respective signal over the time duration yields a respective predetermined value or falls within a respective acceptable range to thereby generate calibrated signals;
a combining unit for combining the calibrated signals.

2. The digital-to-analog converter of claim 1, wherein the adjustment unit is adapted for calibrating electric signals.

3. The digital-to-analog converter of claim 1, wherein the adjustment unit is adapted for calibrating analog signals or digital signals.

4. The digital-to-analog converter of claim 1, wherein the adjustment unit is adapted for calibrating current signals or voltage signals.

5. The digital-to-analog converter of claim 1, wherein the adjustment unit is adapted for maintaining the amplitude of the signals unchanged.

6. The digital-to-analog converter of claim 1, wherein the adjustment unit is adapted for adjusting the time duration of the signals in such a manner that a product of the amplitude and the time duration of the calibrated signals yields a predetermined threshold value.

7. The digital-to-analog converter of claim 1, wherein the adjustment unit is adapted for adjusting the time duration of the signals to be added by the combining unit in such a manner that individual integrals of the amplitude over the time duration of the calibrated signals essentially equal to a predetermined ratio.

8. The digital-to-analog converter of claim 1, wherein the combining unit is adapted for adding the calibrated signals.

9. The digital-to-analog converter of claim 1, further comprising a filter unit coupled to an output of the combining unit.

10. The digital-to-analog converter of claim 9, wherein the filter unit is a low-pass filter or a band-pass filter.

11. The digital-to-analog converter of claim 1, further comprising a dynamic element matching unit.

12. The digital-to-analog converter of claim 1, wherein the digital-to-analog converter is a Nyquist digital-to-analog converter.

13. The digital-to-analog converter of claim 1, wherein the digital-to-analog converter is a Sigma-Delta digital-to-analog converter.

14. The digital-to-analog converter of claim 1, wherein the digital-to-analog converter is an over-sampled multi bit digital-to-analog converter.

15. The digital-to-analog converter of claim 1, wherein the digital-to-analog converter is connected to an analog-to-digital converter so as to function as a feedback digital-to-analog converter.

16. The digital-to-analog converter of claim 1, wherein the digital-to-analog converter is a multiplying digital-to-analog converter, an analog input of the digital-to-analog converter being connected to an analog output of the digital-to-analog converter via a switch unit of the adjustment unit, the switch unit being controlled by a digital input of the digital-to-analog converter so as to adjust the time duration by controlling an on-time of the switch.

17. The digital-to-analog converter of claim 1, wherein the adjustment unit is adapted for adjusting the time duration of the signals by a counter based adjustment.

18. The digital-to-analog converter of claim 1, wherein the adjustment unit is adapted for adjusting the time duration of the signals by a delay line based adjustment.

19. The digital-to-analog converter of claim 1, wherein the combining unit is a digital-to-analog converter unit adapted for converting the plurality of signals representing a digital signal into an analog signal by summing up the plurality of signals; the digital-to-analog converter further comprising a filter unit coupled to an output of the digital-to-analog converter unit.

20. A measurement apparatus, comprising:
a signal generation unit adapted to generate a plurality of signals related to a measurement carried out by the measurement apparatus;
a digital-to-analog converter, for converting digital data into an analog signal, comprising
an adjustment unit for individually adjusting a time duration of a plurality of signals in accordance with the respective amplitude of the respective signal in such a manner that an integral of the amplitude of the respective signal over the time duration yields a respective predetermined value or falls within a respective acceptable range to thereby generate calibrated signals;
a combining unit for combining the calibrated signals.

21. The measurement apparatus of claim 20, further comprising at least one of: an analog-to-digital converter, a sensor device, a test device for testing a device under test or a substance, an amplifier, a multiplying amplifier, a device for chemical, biological and/or pharmaceutical analysis, a fluid separation system adapted for separating compounds of a fluid, a capillary electrophoresis device, a liquid chromatography device, a gas chromatography device, an electronic measurement device, and a mass spectroscopy device.

* * * * *